(12) United States Patent
Dutta

(10) Patent No.: US 7,115,910 B2
(45) Date of Patent: Oct. 3, 2006

(54) MULTICOLOR PHOTODIODE ARRAY AND METHOD OF MANUFACTURING THEREOF

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 70 days.

(21) Appl. No.: 10/709,439

(22) Filed: May 5, 2004

(65) Prior Publication Data

US 2005/0184308 A1  Aug. 25, 2005

Related U.S. Application Data

(60) Provisional application No. 60/467,905, filed on May 5, 2003.

(51) Int. Cl.
*H01L 27/15* (2006.01)

(52) U.S. Cl. ............... 257/80; 257/81; 257/86; 257/94; 257/101; 257/103

(58) Field of Classification Search ............ None
See application file for complete search history.

(56) References Cited

U.S. PATENT DOCUMENTS

| | | | | |
|---|---|---|---|---|
| 5,302,449 | A * | 4/1994 | Eby et al. ............... | 428/336 |
| 6,350,998 | B1 * | 2/2002 | Tsuji ....................... | 257/186 |
| 6,635,908 | B1 * | 10/2003 | Tanaka et al. ............ | 257/186 |
| 6,765,276 | B1 * | 7/2004 | Fasen et al. .............. | 257/437 |
| 6,949,770 | B1 * | 9/2005 | Yamaguchi et al. ...... | 257/79 |

* cited by examiner

*Primary Examiner*—Long Pham
*Assistant Examiner*—Wai-Sing Louie

(57) ABSTRACT

Novel structures of the photodetector having broad spectral ranges detection capability (from UV to 1700 nm (and also 2500 nm)) are provided. The photodetector can offer high quantum efficiency >95% over wide spectral ranges, high frequency response >8.5 GHz. The photodiode array of N×N elements is also provided. The array can also offer wide spectral detection ranges (UV to 1700 nm/2500 nm) with high quantum efficiency >85% and high quantum efficiency of >8.5 GHz, cross-talk of <1%. In the array, each photodiode can be independently addressable. The photodetector element consists of the substrate, buffer layer, absorption layer, contact layer, and the illumination surface with thin contact layer. The illumination surface can be circular, square, rectangular or ellipsometrical in shape. The photodiode array consists of the photodiode elements of N×N, where each element can be independently addressable. The sensor can be fabricated as top-illuminated type or bottom-illuminated type. The photodiode and its array provided in this invention, could be used in multiple purpose applications such as telecommunication, imaging (where CCD and CMOS sensor cannot be used), and also many sensing applications including surveillance, satellite tracking, advanced lidar systems, etc. The most important advantage of this photodiode is that the performance will not be degraded under wide range of temperature variation, which eliminates the use of the temperature controller. Other advantage of this invention is that conventional fabrication technology can be used to fabricate the single photodiode or its array herein described.

21 Claims, 12 Drawing Sheets

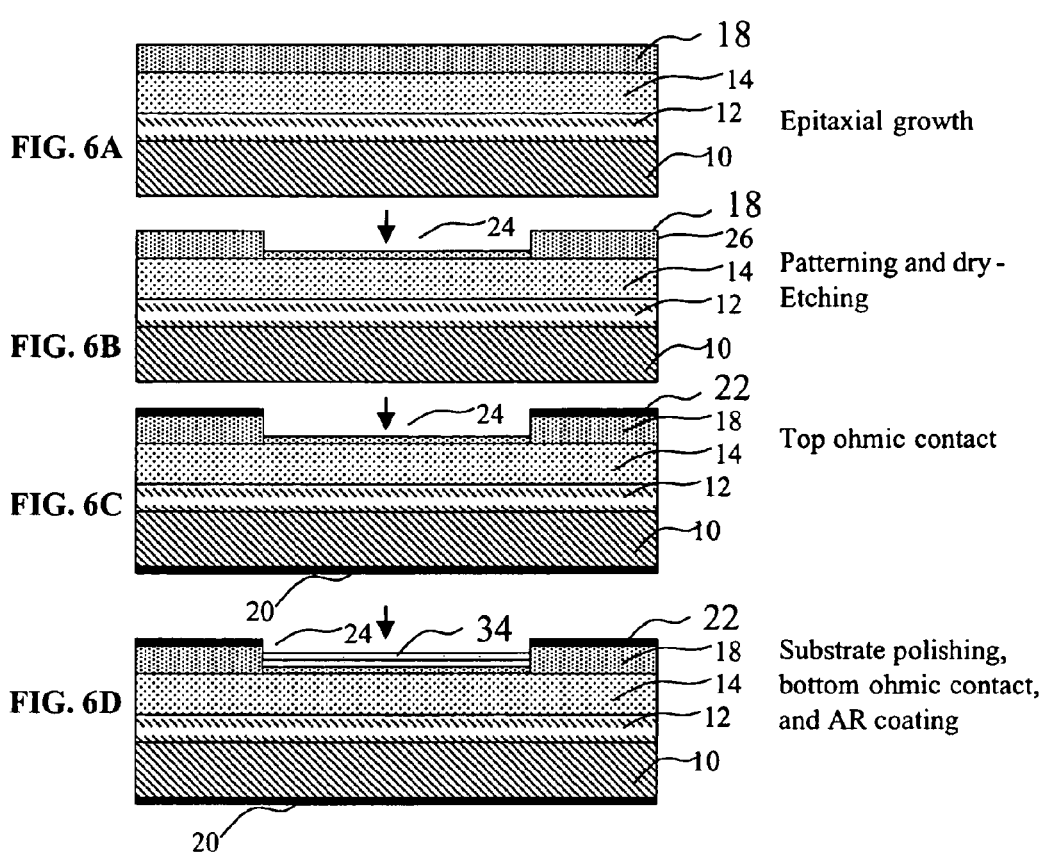

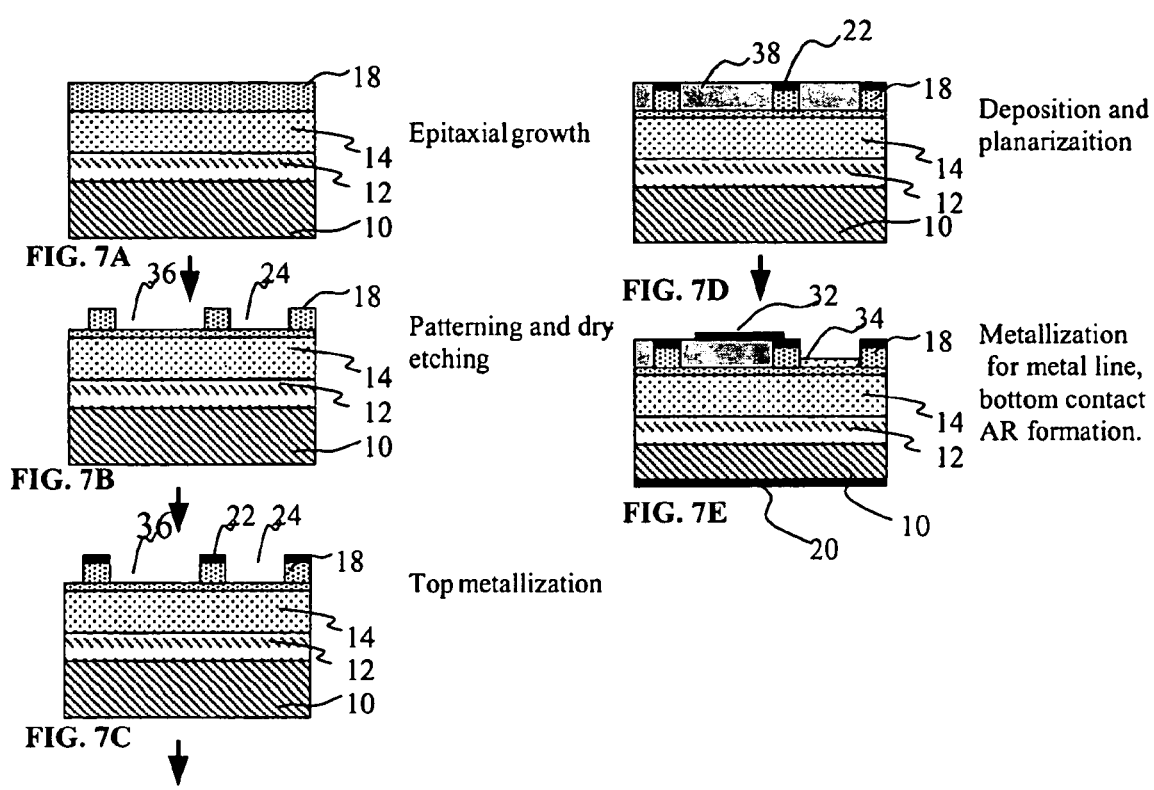

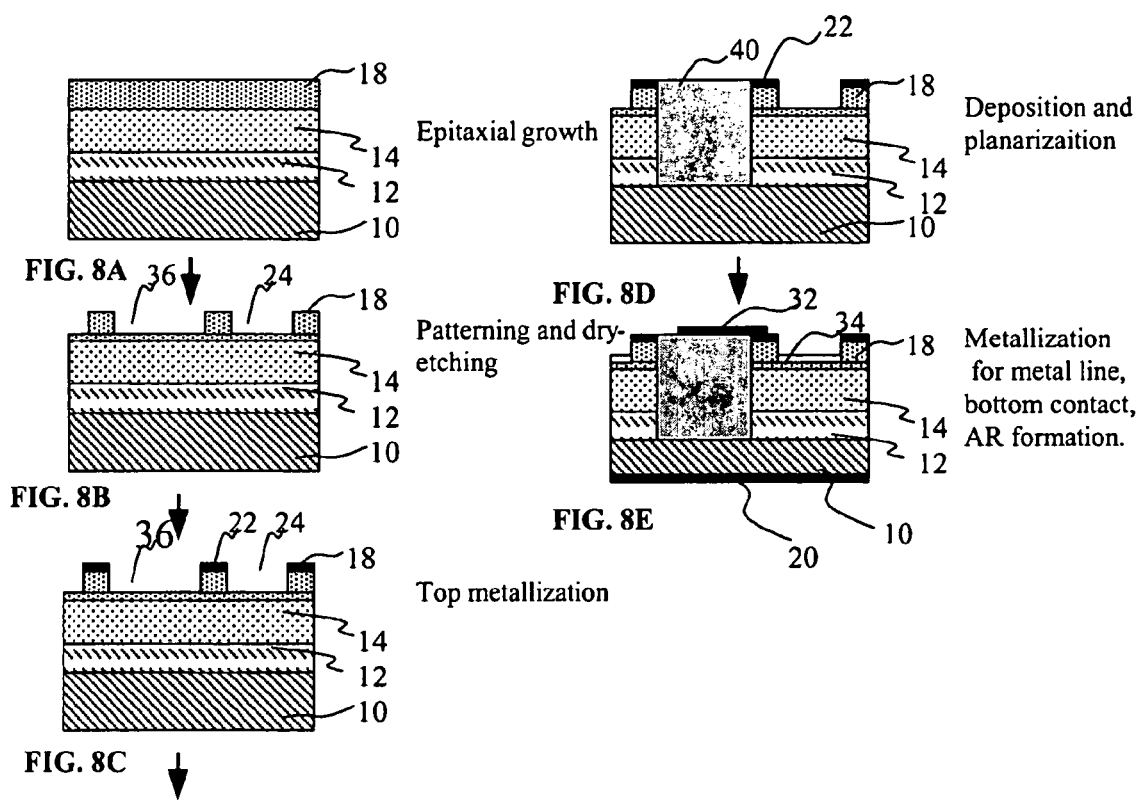

MULTICOLOR PHOTODIODE ARRAY AND METHOD OF MANUFACTURING THEREOF

CROSS REFERENCE TO RELATED APPLICATIONS

This application claims the benefit of U.S. Provisional Application No. 60/467,905 filed May 5, 2003.

BACKGROUND OF INVENTION

This invention relates to optical detector for broad spectral detection covering the wavelengths from ultra-violet (UV) to near infrared. More particularly, this invention is related to the multicolor detector, which can detect the light wavelengths ranges from as low as UV to the wavelengths to 2500 nm covering the most of the sensing and communication wavelengths. This invention is related to the multicolor sensor arrays for multicolor imaging.

Solid-state imaging devices with higher resolution are used in many commercial applications especially camera and also for other light imaging uses. Such imaging devices typically comprise of CCD (charge coupled device) photo detector arrays with associated switching elements, and address (scan) and read out (data) lines. This CCD technology is matured so much that now days a million of pixels and surrounding circuitry can be fabricated using the CMOS (complimentary metal oxide semiconductor) technology. As today's CCD technology is based on silicon (Si)-technology, the detectable spectral ranges are limited to the wavelengths below 1 µm where Si exhibits absorption. Besides, CCD based imaging technique has also other shortcomings such as high efficiency response combined with high quantum efficiency over broad spectral ranges, required for many applications. One of them could be the free space laser communication where shorter (in visible ranges) and near infrared wavelengths are expected to be used. Photodiode array having broad spectral detection capability is expected to provide those features not available in today's CCD technology. With well designed of the array, appreciable resolution can also be achieved in photodiode array technology.

Photodiodes especially of p-i-n type have been studied extensively over the last decade for its application in optical communication. These photodiodes are for near infrared detection, especially the wavelength vicinity to 1310 and 1550 nm. Now a day, the photodetector speed as high as 40 Gb/s, as described in the publication by Dutta et. al. in *IEEE Journal of Lightwave Technology*, vol. 20, pp. 2229–2238 (2002) is achieved. Photodetector having a quantum efficiency as close to 1, as described in the publication by Emsley et. al. in the *IEEE J. Selective Topics in Quantum Electronics*, vol. 8(4), pp. 948–955 (2002), is also available for optical communication. InGaAs material is usually used as absorption material, and the diode is fabricated on the InP wafer. On the other hand, Si based photodiodes are used for detection of visible radiation. For covering broad spectral ranges, conventionally two photodiodes fabricated from Si and InP technology, discretely integrated, are usually used. Although wafer bonding can be used to bond Si and InP to cover the wavelengths from visible to near infrared, the reliability of wafer bonding over wide range of temperature is still an unsolved issue and a high-speed operation is not feasible with a wafer bonding approach. It is highly desirable to have a monolithic photodiode array, which could offer high bandwidth (GHz and above) combined with high quantum efficiency over a broad spectral ranges (UV to 1700 nm/2500 nm). For using especially in imaging purpose where CCD based device is used, the photodiode array with the possibility to rapidly and randomly address any pixel is also very much essential.

It is our objective to develop a monolithic photodiode array for broad spectral ranges covering from UV to 1700 nm/2500 nm wavelength detection with having frequency response as high as 8 GHz and above bandwidth, and high quantum efficiency over 85% over the entire wavelength region.

Our innovative approach utilizes surface-illumination type (top or bottom-illumination type) photodiode structure having single or multiple absorption layer which can provide broad spectral response. The absorption layers will be designed to achieve the required quantum efficiency and also required speed. In array, to make possible to rapidly and randomly address any pixel independently, we will utilize the metal line to connect each pixel separately to the outside contacts pads for top-illumination type detector-array and etch-off substrate (thinning substrate) with flip-chip bonded type individual photodiode element for bottom-illumination type detector array. In top illumination detector array vase, as each metal line usually needs to connect outside pads to inside photodiode pixel, the pitch and element size is limited by the width of the metal line and array number. For example, the element size (i.e. photodiode pixel size) and pitch can be made to 5 µm and 10 µm, respectively, for the array size of 25×25 and metal line of 1 µm. More than 1000×1000 array could be possible for both top and bottom-illumination type detector structures.

According to the current invention, photodiode having broad spectral ranges, high quantum efficiency (>85%), and high frequency response over 10 GHz @ 3 dB, can be fabricated using the single wafer. According to this invention, in the case of photodiode array, each array can also be operated independently. The manufacturing thereof is also simpler as compared with the prior art. Some applications include multicolor imaging applications such as for astronomical observation, imaging etc. Other applications include communication and sensing.

SUMMARY OF INVENTION

Accordingly, it is an object of the invention to provide a structure of the photodiode, which could have the broad spectral detection, ranging from UV to near infrared as high as 1700 nm (and also 2500 nm).

It is also an object that the structure could provide high quantum efficiency 85% and beyond over broad spectral detection ranges, and also the high frequency response, as high as 10 GHz and more (@ 3 dB bandwidth). The structure is easily to fabricate using the standard photodiode fabrication process.

Another object of this invention is to provide the photodiode array structure, which would have the broad spectral detection ranges, and each of its photodiode element (hereafter mentioned as the pixel) could be operated independently. This photodiode array has the CCD like feature in addition to the broad spectral detection capabilities ranging from UV to 2500 nm. This array of high counts can be used for multicolor imaging purpose. According to this invention, the photodiode array can be fabricated monolithically with the fixed filter, and hence based on the filtering wavelength, the device can be used in different sensing and imaging purpose.

According to this invention, the filters with different filtering wavelengths can be integrated monolithically or hybridly with the photodiode array to assign spatially the pixels (arranged in row and column) for the specific filtering wavelengths. By doing that, wide range of filtering wavelengths can be detected using the single photodiode array.

Another object of the present invention is to provide the material types to be used for achieving broader spectral detection ranges for photodiode. These materials are easy to deposit/growth using the standard IC technology.

Another object of the present invention is to provide the fabrication process to fabricate the single photodiode and its array using the standard IC fabrication process.

According to the invention, the single photodiode of top illumination type, comprises: (i) an ohmic contact layer; (ii) a substrate; (iii) a first highly doped buffer layer, material-type same as the substrate; (iv) single or multiple intrinsic layer of InGaAs for absorption layer, fabricated on the top of the first doped layer; (v) a thin layer of doped layer of GaInAs on the top of illumination surface; (vi) a thick layer of doped GaInAs or AlInAs and GaInAs combination on the thin layer and left surrounding illumination surface for the contact layer, and; (vii) second ohmic metal contact layer on the top of the thick-doped layer, wherein the light illumination surface (opening area) could be the circular, rectangular or square shaped, and they are designed able to have the field distribution enough avoiding the diffusion related current.

According to the invention, the single photodiode of bottom illumination type, comprises: (i) a common bottom ohmic contact layer; (ii) an etch-off substrate or thinning substrate; (iii) a first highly doped buffer layer, material-type same as the substrate; (iv) single or multiple intrinsic layer of InGaAs for absorption layer, fabricated on the top of the first doped layer; (v) a thick layer of doped GaInAs or AlInAs and GaInAs combination, and; (vi) second ohmic metal contact layer on the top of the thick-doped layer, wherein the light is illuminated from the substrate etch-off portion and the illumination surface (opening area) could be the circular, rectangular or square shaped.

According to the invention, the top-illumination type photodiode array comprises: (i) N×N photodiodes, wherein each photodiode comprises, (a) a common bottom ohmic contact layer; (b) a substrate; (c) a first high doped buffer layer, material-type same as the substrate; (d) intrinsic layer of InGaAs for absorption layer, fabricated on the top of the first doped layer; (e) a thin layer of doped-GaInAs layer including the opening light illumination surface; (f) a thick layer of doped GaInAs or doped AlInAs and GaInAs combination layers on the thin layer and left surrounding the light illuminated surface for the contact layer; (g) a top ohmic contact; and (h) interconnection metal lines connecting each photodiode to the outside pad, wherein each photodiode is independently addressable. According to this invention, each photodiode in the array can be isolated from each other to reduce the cross-talk by etching each photodiode's surrounding area up to absorption layer or up to thick buffer layer.

According to the invention, the photodiode array of top-illumination type, comprises: (i) N×N photodiodes, wherein each photodiode comprises, (a) a common bottom ohmic contact layer; (b) a substrate; (c) a first high doped buffer layer, material-type same as the substrate; (d) intrinsic layer of InGaAs for absorption layer, fabricated on the top of the first doped layer; (e) a thin layer of doped GaInAs; (f) a thick layer of doped GaInAs or doped AlInAs and GaInAs combination layers on the thin layer and left surrounding the light illumination surface for the contact layer; (g) a top ohmic contact layer; and (h) interconnection metal lines connecting each photodiode in a way that at a time only one photodiode signal can be taken out located in the same row and column. According to this invention, to reduce the cross-talk, each photodiode in the array can be isolated by etching the each photodiode's surrounding area up to absorption layer or thick buffer layer.

According to this invention, the photodiode metal contact, connecting each photodiode element to the outside pad can be designed in a way that metal contacts of the photodiodes located one-fourth of the array are designed to align in two sides. Replica of this metal layout can be copied for metal contacts alignment for other photodiodes located in the three-fourth of the array.

According to the invention, the bottom-illumination type photodiode array comprises: (i) N×N photodiodes, wherein each photodiode comprises, (a) a common ohmic contact layer on the back side of the substrate for all photodiodes in the array; (b) an etch-off substrate (or thinning substrate); (c) a first high doped buffer layer, material-type same as the substrate; (d) single or multiple intrinsic layer of InGaAs for absorption layer, fabricated on top of the first doped layer; (e) single or multiple layers doped GaInAs or doped AlInAs and GaInAs combination layers, and (f) ohmic contact layer for each photodiode, wherein the light is illuminated from the back-side of the substrate, especially from the etch-off area. According to this invention, the substrate etch-off portion (opening area) is located where N×N array are, and the illumination surface could be circular, square, or rectangular-shaped. According to this invention, to reduce the cross-talk, each photodiode can be isolated from each other by etching each photodiode's surrounding area up to absorption layer or thick buffer layer.

According to the invention, the fabrication process of the top-illumination type photodiode comprises: (i) growing the layers forming the photodiode structure on the substrate; (ii) patterning and dry etching the second high doped layer to open the illumination surface; (iii) formation of the top ohmic contact; (iv) polishing the substrate and formation of the bottom ohmic contact, and; (v) formation of the AR coating.

According to the invention, the fabrication process of the top-illumination type photodiode array comprises: (i) growing the layers forming the photodiode structure on the substrate; (ii) patterning and dry etching the second high doped layer to open the illumination surface; (iii) formation of the top ohmic contact; (iv) patterning and dry-etching the diode structure to isolate from each other; (vi) depositing the step coverage layer and planarization; (vii) patterning and formation metal contact connecting the photodiode contact to the outside pad; (viii) patterning and etch out the dielectric portion from the illumination surface, and (ix) formation of the common ohmic contact at the backside of the substrate.

According to this invention, the antireflection (AR) coating layer compatible for the wavelength ranges of detection could be used at the top of the illumination surface to reduce the reflection loss. This AR coating could be the single layer or multi-layer combinations.

Alternatively, according to the invention, the fabrication process of the photodiode array comprises: (i) growing the layers forming the photodiode structure on the substrate; (ii) patterning and dry etching the second high doped layer to thin layer appropriate to transmit the illumination light with no loss; (iii) formation of the top ohmic contact; (iv) patterning and dry-etching to isolate each diode from each others; (v) depositing the dielectric layer and planarization; (vi) patterning and formation metal contact connecting the photodiode contact to the outside pad using the molding (like nano and microlevel imprinting), and; (vii) formation of the common ohmic contact at the backside of the substrate.

According to this invention, the fixed or tunable filter can be fabricated monolithically on the photodiode array to tune the wavelength to be illumination onto the photodiode array. The filter could be also integrated discretely.

According to this invention, the photodiode element or photodiode array can be fabricated with bottom illumination type by etching substrate to open the illumination surface. In this case, metal interconnection is not necessary and the array (or single photodiode) can be flip-chipped bonded and the each pixel in the case of the array can be independently addressable.

According to this invention, the substrate could be InP or GaAs, and absorption layer is InGaAs with thickness appropriate to get high quantum efficiency and high frequency response.

According to this invention, the interface between the InP and InGaAs can be made smooth junction using the grading layer in between.

The invention offers to detect broad detection ranges varying from UV to near infrared as high as 1700 nm (or 2500 nm) with high quantum efficiency and high frequency response. With proper design and fabrication process, N×N photodiodes array can be fabricated with capability of independently addressable each photodiode. The photodiode array will not only have the detection capability what the CCD or CMOS sensor covers, but it also has the capability of the infrared detection. The signal processing circuit can also be integrated monolithically or hybrid. These inventions could be easily implementable as today's manufacturing technology. The detector mentioned in this invention will be used for multiple purpose optical detection for many applications.

Another advantage of this invention is that conventional material and IC fabrication technology can be usable to fabricate this photodiode and its array.

Other objects, features, and advantages of the present invention will be apparent from the accompanying drawings and from the detailed description that follows below.

BRIEF DESCRIPTION OF DRAWINGS

The invention will be explained in more detail in conjunction with the appended drawings wherein.

FIGS. 6(a) to FIG. 6(d) is the schematics showing the fabrication process of the single photodiode in the fourth embodiment in accordance to the present invention;

FIGS. 7(a) to 7(e) is the schematics showing the cross-sectional views of the fabrication process for the photodiode array in the fifth embodiment in accordance to the present invention. The cross-section was taken in the direction of A—A of FIG. 5(a).

FIGS. 8(a) to 8(e) is the schematics showing the cross-sectional views of the fabrication process for the photodiode array in the sixth embodiment in accordance to the present invention. The cross-section was taken in the direction of A—A of FIG. 5(a).

DETAILED DESCRIPTION

Figure 1A:
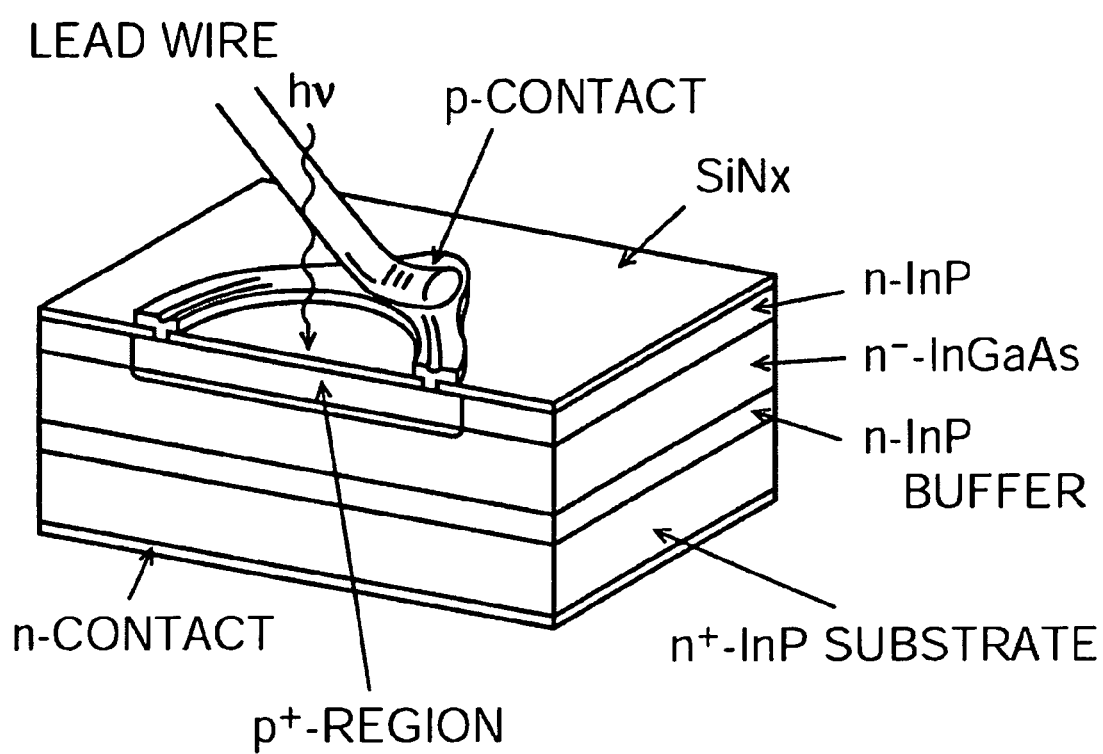
FIGS. 1(a) and 1(b) are the schematics showing the cross-sectional views of photodiode structures. These are the explanatory diagrams showing the prior-art of today's photodiode using quarter-wavelength stacks.

The best modes for carrying out the present invention will be described in turn with reference to the accompanying drawings. In the following description, the same reference numerals denote components having substantially the same functions and arrangements, and duplicate explanation will be made only where necessary.

Here the structure and design we mention are for the top illumination type photodetector and its array having broad spectral detection ranges. The outside structure of the photodiode can be modified to make it bottom illumination type.

Figure 1B:
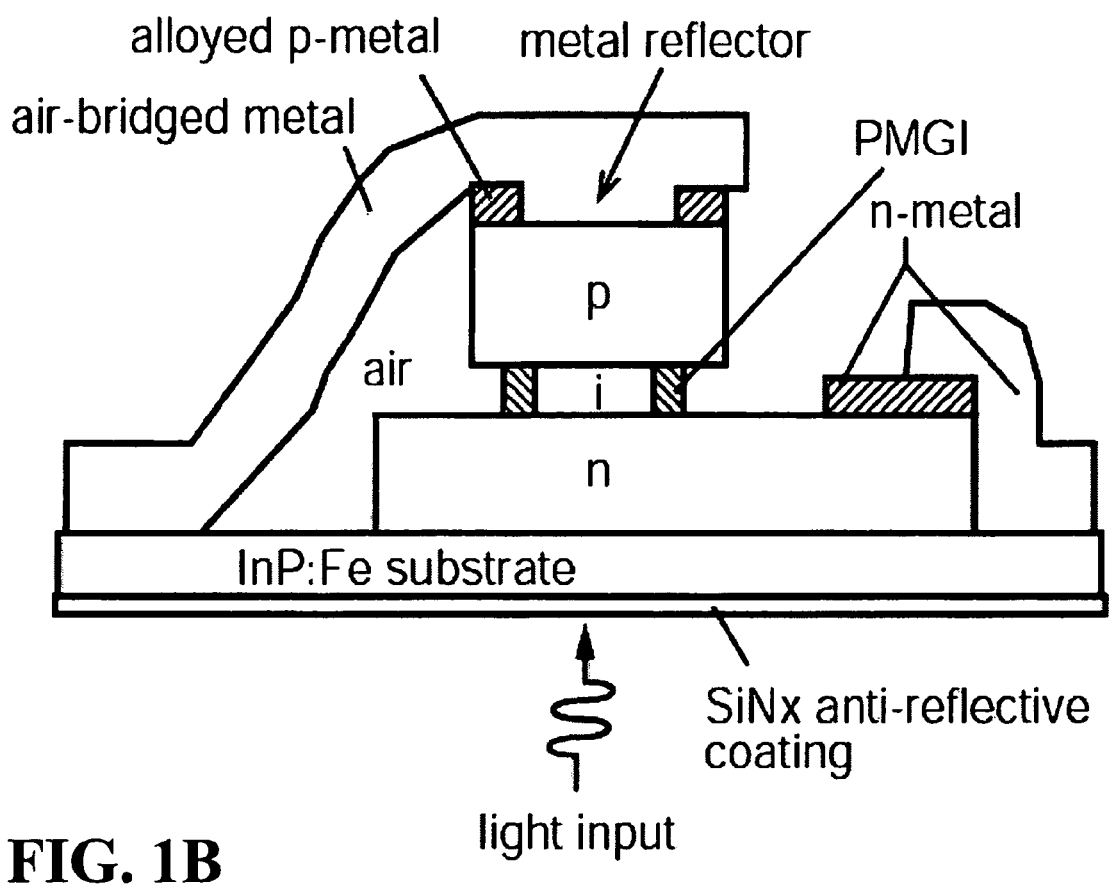

Indium phosphide (InP) based photodiodes especially of p-i-n type have been studied extensively over the last decade for its application in optical communication. These photodiodes are based on the structure and material system, which can detect the wavelengths covering from 1000 nm to 1650 nm. FIGS. 1(a) and 1(b) shows a cross-sectional view of prior art of photodiodes of top- and bottom-illumination type. In most cases a thin layer of InGaAs acting as the absorption region, is sandwiched between two layers of doped InP. These two materials (InGaAs and InP) combination used in the photodiode determine mainly photodiode's spectral detection region. Details of the prior art photodiode can be found in the chapter written by K. Taguchi, in the book, entitled "*WDM Technologies: Active Optical Components*" (Editors: A. K. Dutta et. al.), published by Academic Press, Boston, Mass. in 2002.

Figure 2A:
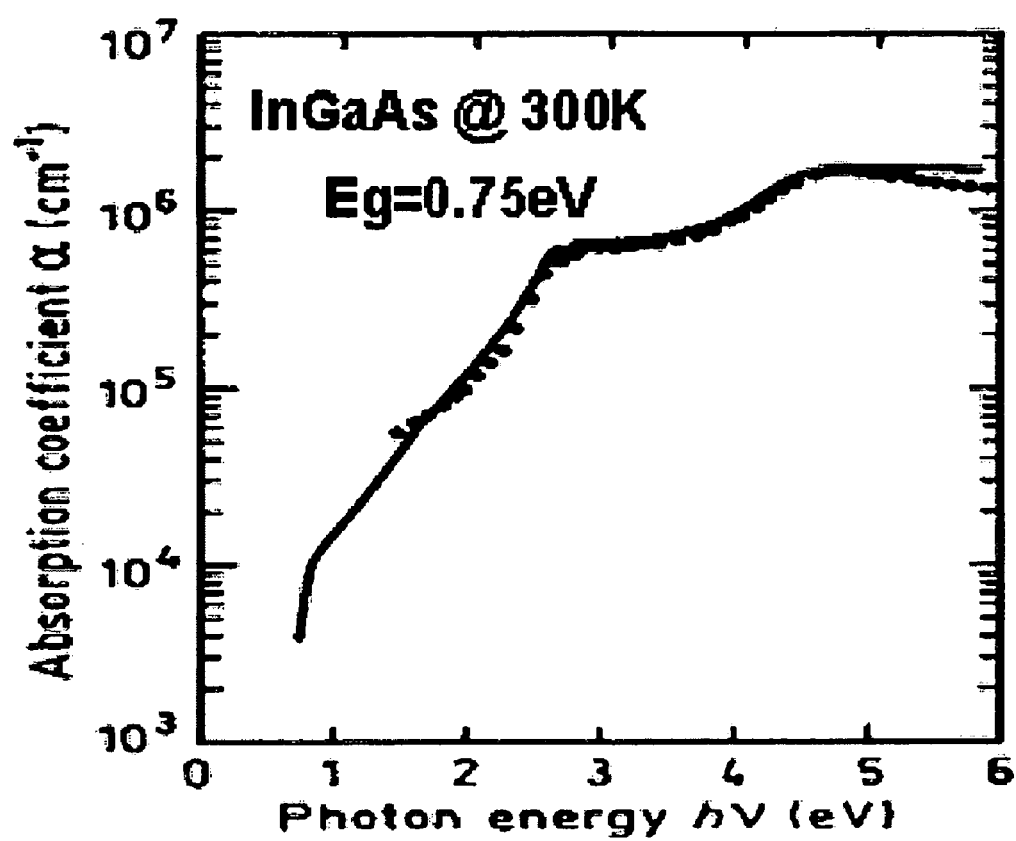
FIG. 2 is the absorption-coefficient of (a) InGaAs of bandgap (0.75 eV), and (b) InP of bandgap 1.34 eV versus photon energies.
Figure 2B:
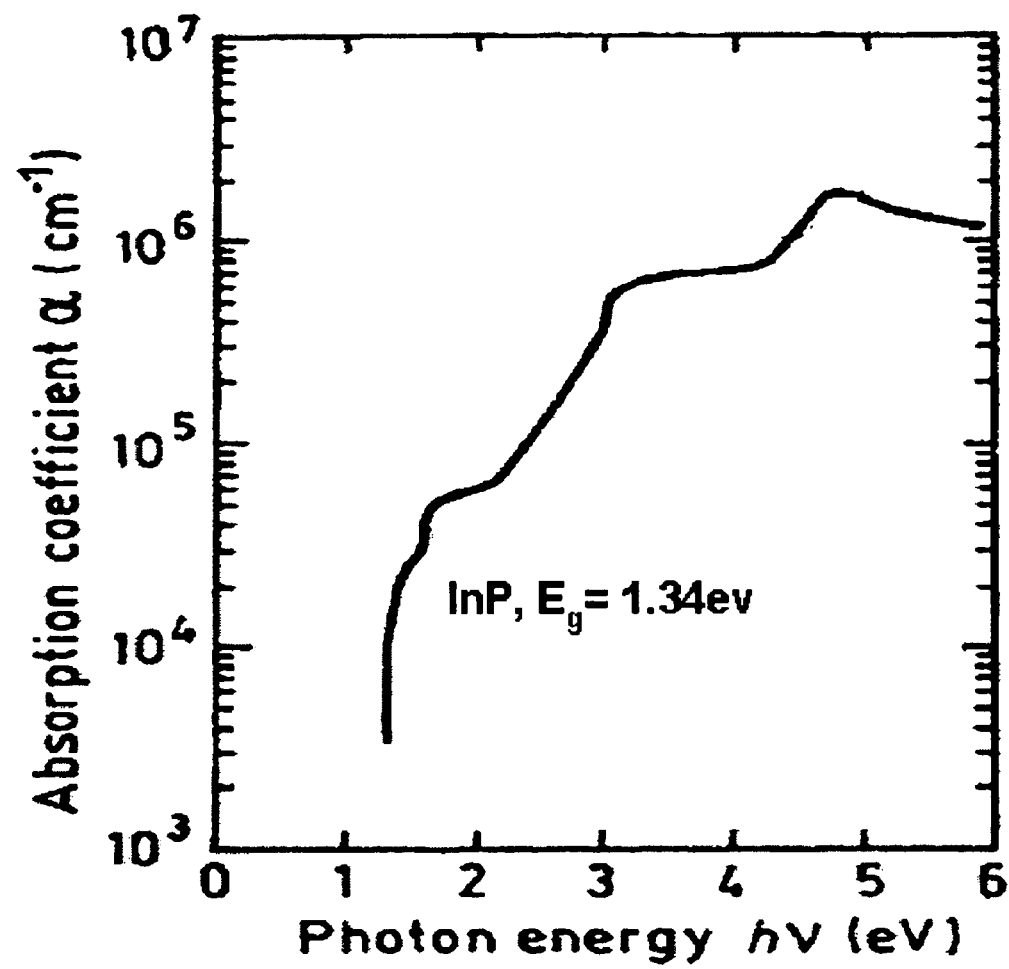

The absorption spectra of InGaAs (lattice matched to InP)and InP materials are shown in FIGS. 2(a) and 2(b). The bandgaps of InGaAs and InP are 0.75 eV and 1.34 eV, which correspond to wavelengths of ~1700 nm and ~950 nm, respectively. The absorption coefficient of these material increases with increasing of photon energy. Any photodiode made using InGaAs as the active absorption layer is expected to absorb all the wavelengths from UV (ultraviolet) to 1700 nm unless some photons are selectively blocked. With using multiple InGaAs layers with different contents, the detection ranges can be extended from UV to 2500 nm.

After carefully looking at FIGS. 1 and 2, one can understand why conventional device structure as shown in FIGS. 1(a) and 1(b) cannot respond to any photon with a wavelength below 1000 nm. The reason is that the InP contact layer absorp the light of wavelengths below 950 nm. Any photon absorption in doped InP contact layers doesn't generate any electrical response in the device (if carrier diffusion is neglected). Thus, photodiodes in prior art are not suitable for broad spectral ranges covering from UV to 1700 nm.

In the prior art, a wafer bonding technique (not shown) is also usually used to design a photodetector with wide spectral response. In such devices, longer wavelengths are absorbed by a device structure shown in FIG. 1, while shorter wavelengths are detected by a Silicon photodiode, wafer bonded to an InP based structure. As the linear thermal coefficient of expansion (TCE) of InP and Si are $4.60\times10^{-6}$ °C.$^{-1}$, and $2.60\times10^{-6}$ °C.$^{-1}$, respectively, the TCE mismatches cause stress in a wafer-bonded structure in wide temperature ranges operation. In addition, making an array with a wafer bonded structure poses a great challenge in designing interconnect with the aim of addressing individual pixels.

If the photodiode structure consists of InGaAs (lattice matched to InP) as a absorption layer, and a ohmic contact layers which do not absorb significant number of photons, the photodiode can be used in wide spectral regions covering from UV to 2500 nm. In the present invention, the photodiode structure is mentioned which could have broad spectral range detection varying from UV to ~1700 nm with high quantum efficiency and high frequency response. Using single of multiple layer of InGaAs having different contents, the detector can also be fabricated for wide range of detection where InGaAs absorb. For example from UV to 2500 nm spectral detection can be possible using the photodetector mentioned here.

Figure 3:
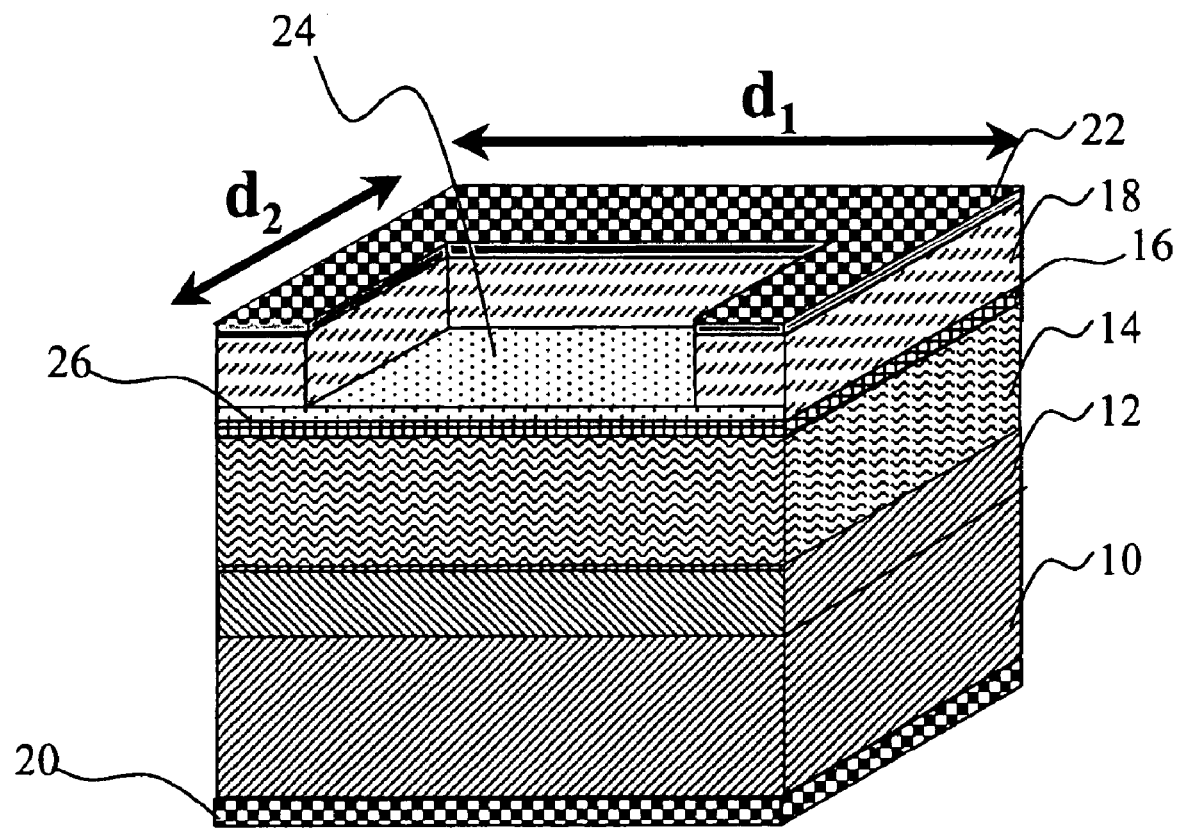
FIG. 3 is the schematic showing the cross-sectional view of a photodiode structure in the first embodiment in accordance to the present invention.

FIG. 3 shows the schematic showing the cross-sectional view of the photodetector having wide spectral detection ranges in the first embodiment in accordance to the present invention. Photodiode material layers structure as shown in FIG. 3, consists of n type InP substrate 10, n+ InP buffer layer 12, InGaAs absorption layer 14, spacer layer of InGaAs layer 16, and InGaAs ohmic contact layer 18. Photodiode has the n type ohmic contact 20 at the backside of the substrate 10, and p type of ohmic contact 22 at the top of the photodiode. The photodiode has the opening illumination surface 24 at the top for incident the light. A thin layer of the GaInAs 26 is left underneath the opening surface to extend the electrical field over the illumination surface. The photodiode has the shape of rectangular or square having the width and length of $d_1$ and $d_2$, respectively. The width of the top ohmic contact 22 can have the 1 μm to 2 μm, appropriate for the ohmic contact using the standard photolithography technique. The details of this fabrication will be explained later section. Using the nano-imprint (not shown), however, the width can be reduced to nanoscale level and illumination surface area can be increased.

The top ohmic contact (p-doped) InGaAs layer is made to thin close to ~10 nm or less to reduce the absorption and also reduce diffusion induced current. For 10 nm InGaAs thickness, the doped InGaAs thin layer will absorb less than 1% of the input power at 1700 nm wavelength and less than 5% at UV wavelengths. Incorporating a thin spacer layer in between intrinsic absorption layer and p-ohmic contact layer will prevent the p-dopant from diffusing to absorption layer. Using single of multiple layer of InGaAs having different contents, the detector can also be fabricated for wide range of detection where InGaAs absorb. For example from UV to 2500 nm spectral detection can be possible using the photodetector mentioned here.

The absorption layer thickness could be 1 to 4 μm to increase the quantum efficiency with compromising with the frequency response. It is estimated that the photodiode with thick absorption layer of 3.5 μm $Ga_{0.47}In_{0.53}As$ that ensures a quantum efficiency (QE) of more than 90% at 1650 nm wavelength and much higher QE for shorter wavelengths as is suggested by FIG. 2(a).

In the preferred embodiment as shown in FIG. 3, the photodiode shape is shown to be square or rectangular, the shape can be also circular or ellipsometric, as necessary for the specific application. With using the similar approach, bottom illumination type photodiode can also be designed. The photodiode can be 5 μm×5 μm with an opening of 3 μm×4 μm for receiving light. For using of the highly $p^{++}$ doped InGaAs layer, $In_{0.47}Ga_{0.53}As$ type with highly doped p- can be used. The p-ohmic contact is a thin ohmic contact on a highly doped InGaAs layer with a dopant concentration of $>10^{20}/cm^3$. The frequency response of the structure is estimated to be 8 GHz at 3 dB. The capacitance of the device is in the sub femto-Farad range due to the small junction area, and thick absorption layer. Overall frequency response is limited by the transit time response and the structure can easily operate above 5 GHz bandwidth at 3 dB with quantum efficiency greater than 90% for any wavelengths from UV up to ~1700 nm. Using single of multiple layer of InGaAs having different contents, the detector can also be fabricated for wide range of detection where InGaAs absorb, especially from UV to 2500 nm with QE over 80% over wide range of spectral region.

Alternatively, highly p-doped InP layer can also be used instead of highly p-doped $In_{0.47}Ga_{0.53}As$ on the top of the InGaAs absorption layer. The layer is to be made to thin to ~10 nm to suppress the InP absorption for the shorter wavelength.

Figure 4:
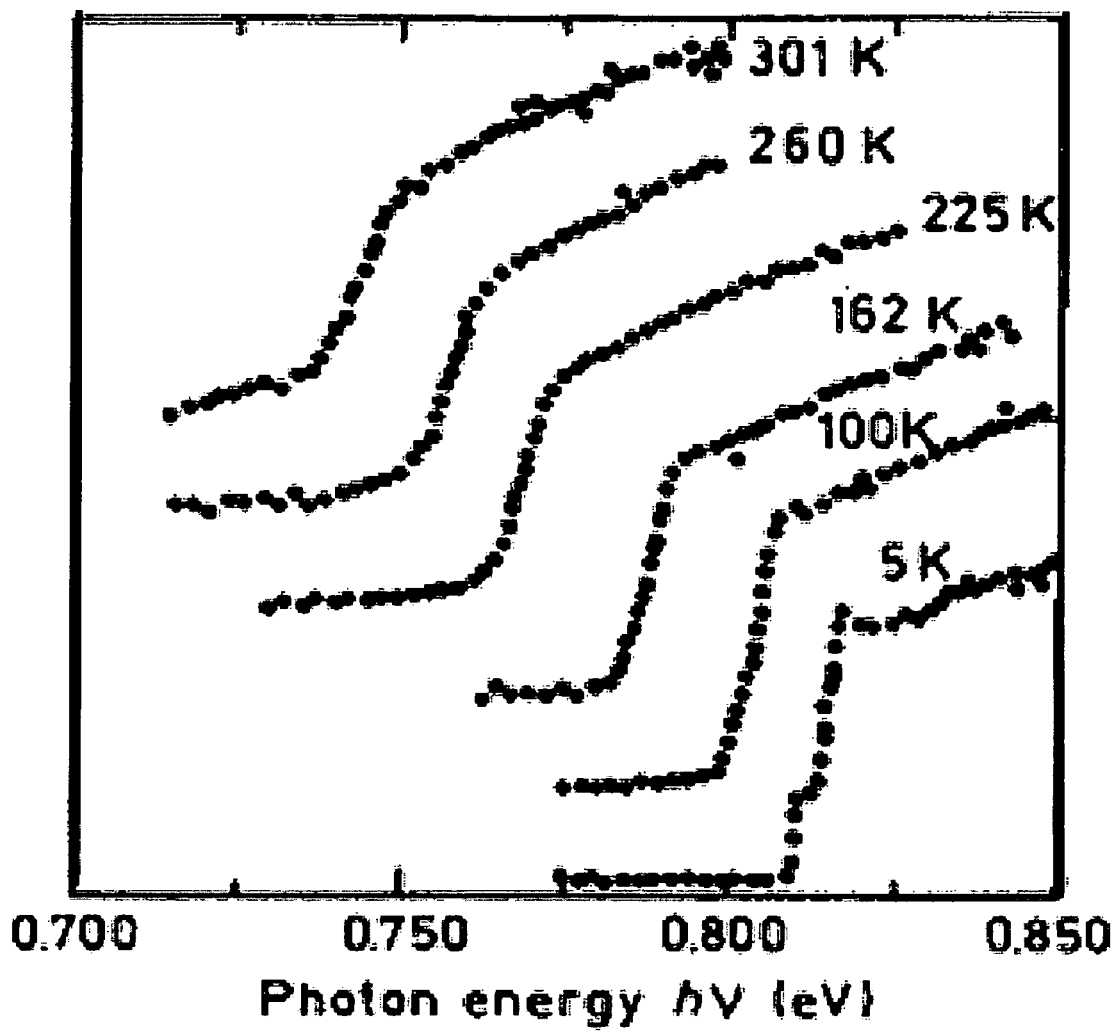
FIG. 4 is the bandgap variation of InGaAs with temperature in the second embodiment in accordance to the present invention. Curves are shifted vertically for clarity.

FIG. 4 shows the bandgap variation of InGaAs with temperature in the second embodiment in accordance to the present invention. FIG. 4 depicts the range of temperature we can operate the proposed photodiode. Unlike a widewavelength wafer bonded photodiode, this present invented photodiode is capable of operating at any temperature with slight variation in the quantum efficiency for long wavelengths as the bandgap increases with decreasing temperature. At 5K, the bandgap of InGaAs increases to 0.81 eV (~1540 nm) while it is 0.75 eV (~1650 nm) at 300K. This will restrict the operating wavelengths to 1540 nm at 5K.

Figures 5A, 5B:
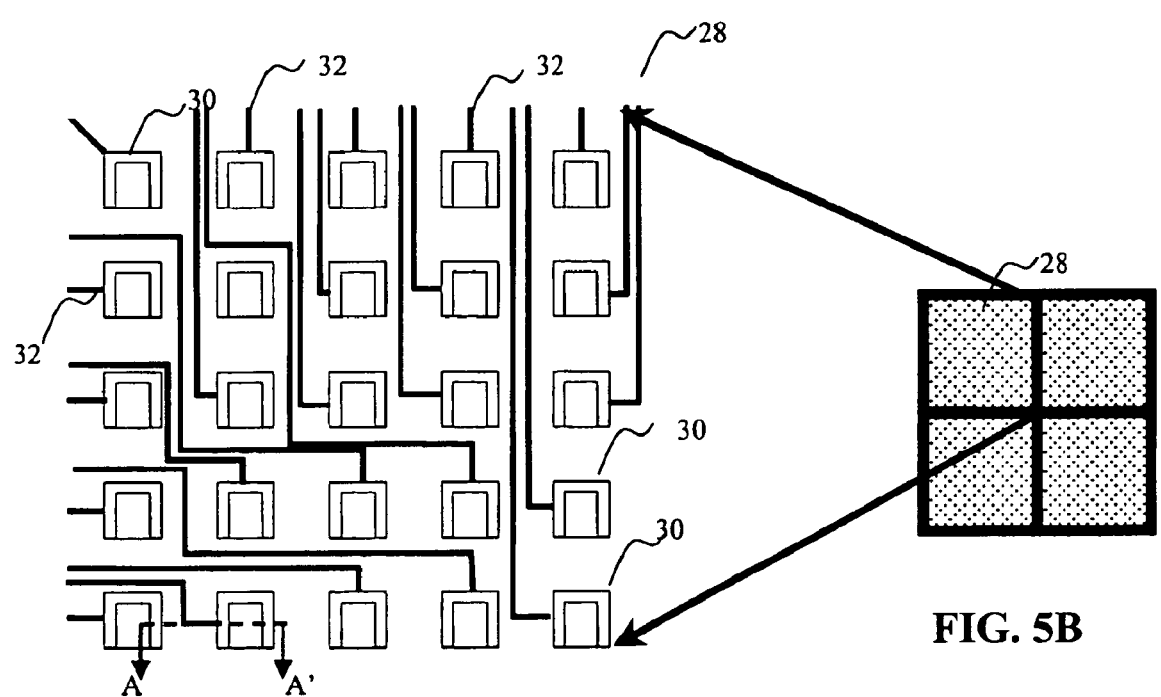
FIGS. 5(a) and 5(b) are the interconnection layout of (a) the photodiode array of 5×5 photodiodes and (b) area of photodiode array of more 25×25 elements segments independently addressable, in the third preferred embodiment in accordance to the present invention. Outside pad connection is not shown. One-fourth of the interconnection lay out of 25×25 elements segments is shown here. More than 1000× 1000 elements segments are possible. Each photodiode elements structure is the same as those as shown in FIG. 3. This is an explanatory diagram of the photodiode array in the embodiments.

FIG. 5 is the interconnection layout of (a) the photodiode array of 5×5 photodiodes and (b) area of photodiode array of 25×25 elements segments independently addressable, in the third preferred embodiment in accordance to the present invention, wherein the like parts are represented by the like numerals so that repeated explanation is omitted here. For the sake of simplicity in the drawing, outside pad connection is not shown. One-fourth of the interconnection lay out 28 for 25×25 elements segments is shown in FIG. 5(a). Rest of the other portions shown in FIG. 5(b) will be the similar and copy. Using 25×25 segments, more than 1000×1000 elements of array can be fabricated, where all pixels can be independently addressable.

Each photodiode elements structure 30 is the same as those as shown in FIG. 3. This is an explanatory diagram of the photodode array in the embodiments. The metal connect 32 connects each photodiode element to the outside pad (not shown), which is independently addressable.

For simplicity in drawing, we have shown only 5×5 array, which is one-fourth section of 25×25 element segment. Using of the 25×25 segments, more than 1000×1000 array can be fabricated. Each photodiode can have the junction area of 5×5 μm$^2$ or more (square shaped) with receiving area of approximately 3×4 μm$^2$ after considering the electrode width. The circular or rectangular shaped electrode shape can also be thought for the same photodiode. Each photodiode element is etched to substrate to isolate from other photodiode array. This would suppress the cross talk below <1%. The photodiode array is expected to offer high quantum efficiency of >90%, high speed >8 GHz at 3 dB (considering the parasitic of metal line), and also can be used in a wide range of temperatures and wavelengths.

Each photodiode element of the proposed array can also be rapidly and randomly addressed based on the metal connection scheme, as shown in FIG. 5. The metal connection can be made using the standard photolithography technique. The advantage of this photodiode array is that it can be fabricated using the less process step than conventional CCD.

FIGS. 6(*a*) to 6(*d*) are the schematics showing the fabrication process of the single photodiode element in the fourth embodiment in accordance with the present invention wherein the same parts are represented by the same numerals so that repeated explanation is omitted here. This fabrication process described here is only for example. The required buffer InP layer 12, absorption layer InGaAs 14, and high doped InGaAs layer 18 are deposited on the substrate 10 using standard deposition techniques such as chemical vapor deposition, molecular beam epitaxial technique etc. Noted that, required spacer layer (not shown) avoiding the doping diffusion into the absorption layer may require. Patterning and subsequent dry etching would open the illumination surface 24. The thin layer 26 of InGaAs is kept left, and its thickness can be designed to reduce the absorption, and also to distribute the electrical field uniformly over the illumination surface. Metallization for bottom and top ohmic contacts 20 and 22 are made, which is followed by formation of the AR coating 34 on the front surface.

FIGS. 7(*a*) to 7(*e*) are the schematics showing the cross-sectional views of the fabrication process of the photodiode array, in the fifth embodiment, wherein the like part represented by the like numeral so that repeated explanation is omitted here. The cross-sectional views, as shown in FIG. 7, is taken across A—A direction of FIG. 5(*a*). In the preferred embodiment, the pitch and photodiode element size in the array are selected based on the quantum efficiency, speed, and detection resolution. In the preferred embodiment, patterning and subsequent dry etching to open the illumination surface portion 24, and the space between the photodiode element 36 are done. After top metallization for ohmic contact 22, dielectric layer 38 deposition and subsequent planarization is required to draw the metal line on the top of the surface. For planarization, standard chemical mechanical polishing (CMP) can be used. Required patternization, and subsequent metallization for the metal line 32 are required. Following polishing (not shown) and metallization for ohmic contact 20 at the backside of the substrate, AR coating 34 is done. Noted here that additional processes (not shown) (a) for etching out the dielectric layer from the illumination surface, and (b) for etching more deeper down to the high resistive absorption layer to isolate the each photodiode from each other.

FIGS. 8(*a*) to 8(*e*) are the schematics showing the cross-sectional views of the fabrication process of the photodiode array, in the sixth embodiment, wherein the like parts represented by the like numeral so that repeated explanation is omitted here. The cross-sectional views, as shown in FIG. 8, are taken across A—A direction of FIG. 5(*a*). In the preferred embodiment, before depositing the dielectric layer 40, additional dry-etching process is performed to etch down to the substrate for the space 36 for isolating each photodiode element from each other. This can reduce the cross-talk <1%. Other processes are the same as those, as explained previously so that repeated explanation is omitted here.

Figure 9A:
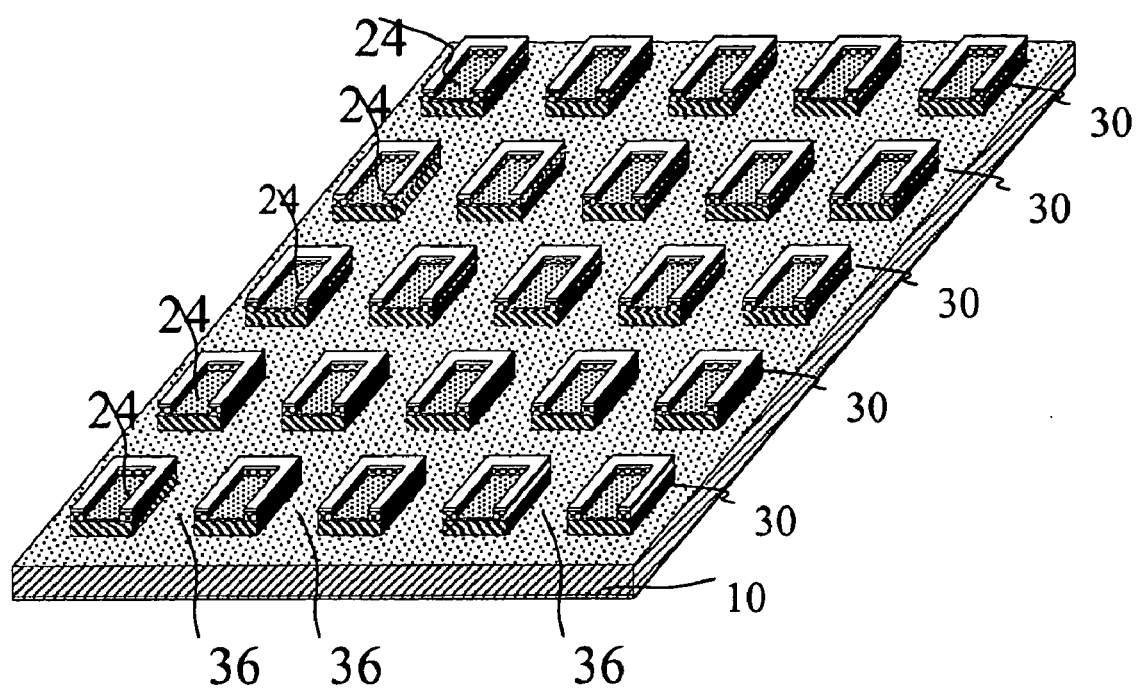
FIGS. 9(a) and 9(b) are the schematic showing the cross-sectional views of the photodiode array of the 5×5 elements (a) after isolation and (b) after planarization in the preferred embodiment in accordance to the present invention.
Figure 9B:
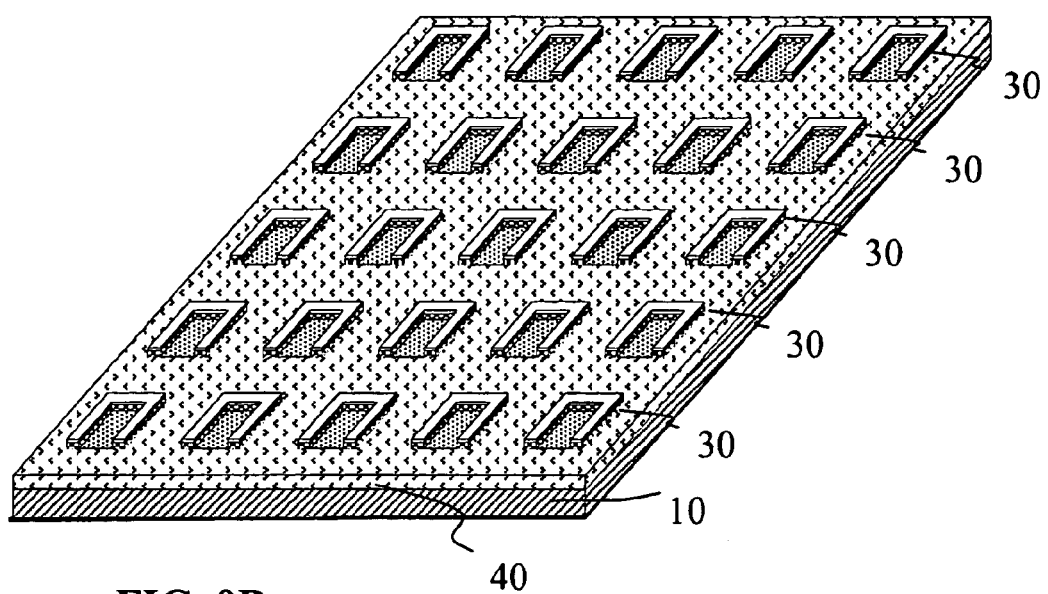

FIGS. 9(*a*) and 9(*b*) are the schematic showing the cross-sectional views of the photodiode array of the 5×5 elements (a) after isolation and (b) after planarization in the preferred embodiment in accordance to the present invention. One fourth of the 25×25 elements segments for N×N array are considered. FIG. 9 is for the explanatory diagram showing the example of the present invention in array form. Metal line interconnection is not shown for simplicity in drawing.

In the preferred embodiment, photodiode structure consisting of the InP substrate, buffer layer, and InGaAs absorption layer, and InGaAs doping layer are shown. As an absorption layer, all types of InGaAs with different contents (having different bandgaps), covers this invention. In addition, instead of using the InGaAs as the doping layer, highly doped InAlAs (not shown) can also be used. In this case, the graded layer can be incorporated in the structure to reduce the minority carrier trapping at the InAlAs—In—GaAs band edge discontinuity. Alternatively, the combination of the highly doped InAlAs and high doped InGaAs layers (not shown) can also be used as the contact layer. For lattice matching and also for achieving higher performance, thin layers in between each main layers which have not shown here, may also requires. This invention also covers the photodiode structure with all such layers.

In the preferred embodiment, top illumination type photodiode and its array are described. For bottom illumination type photodiode, similar structure concept especially using InGaAs absorption layer can also be thought using of the substrate type either transparent or etch-off the lossy substrate. In bottom-illumination type case, top interconnection metal line as shown in top illumination type photo-diode structure is not required. For making the independently addressable, each top contacts can be flip-chip bonded with the pads (in the carrier) which connect to the external circuit. Light can be illumination from the bottom etch-off substrate or transparent substrate. Compound semiconductors such as InP or GaAs etc. (or other transparent substrate) can be used for this purpose.

In the preferred embodiment, we have explained the fabrication process compatible for standard fabrication process. The metal line can be fabricated to connect each photodiode element with the outside pad using of the nano imprint technology or molding. This would help to increase the photodiode surface wider and/or to increase the pitch of the array. Increasing the pitch of the array would help to increase the detection resolution.

In the preferred embodiment, the single and also array type of structure is explained, this invention also covers the devices where the fixed or tunable filter is also integrated monolithically or discretely with the photodiode (single or in array form) to increase the applications. Using the filtering capability with the photodiode, processing across several specific along the wide spectrum can be possible.

According to this invention, the filters with different filtering wavelengths can be integrated monolithically or hybridly with the photodiode array to assign spatially the pixels (arranged in row and column) for the specific filtering wavelengths spatially. By doing that, wide range of filtering wavelengths can be detected spatially using the single photodiode array and can be used for various imaging and remote sensing applications.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is our object to have the photodiode structure, which could provide the broad spectral detection capability ranges from UV to 1700 nm, high quantum efficiency >90%, and high frequency response (e.g. >10 GHz frequency response at 3 dB for the photodiode size of 5 μm). This invention also covers the photodiode structure having the absorption layer consisting of single or multiple combinations of different InGaAs with different contents. With using of such absorption layers, the infrared detection capability can be also extended from UV to as high as 3000 nm.

According to the present invention, it is our also object to provide the photodiode array of N×N elements which could also provide the broad spectral detection capability ranges from UV to 1700 nm, high quantum efficiency >95%, and high frequency response (e.g. >8.5 GHz frequency response at 3 dB for the photodiode size of 5 μm and the pitch of 10 μm). Better frequency response can also be expected if the metal line is designed as the transmission line of coplanar line or microstrip line types. This invention also covers the photodiode array structure having the absorption layer consisting of single or multiple combinations of different InGaAs with different contents. With using of such absorption layers, the infrared detection capability can be also extended from UV to as high as 3000 nm.

It is also our object to have the photodiode structure, which can provide stable spectral detection performance under wide range of temperature variation. Unlike a wide-wavelength wafer bonded photodiode, this present invented photodiode is capable of operating at any temperature with slight variation in the quantum efficiency for long wavelengths as the bandgap increases with decreasing temperature. At 5K, the bandgap of InGaAs increases to 0.81 eV (~1540 nm) while it is 0.75 eV (~1650 nm) at 300K. This will restrict the operating wavelengths to 1540 nm at 5K.

In the preferred embodiment, the photodiode array of N×N elements where each photodiode can be addressable independently is explained. Photodiode array having broad spectral detection ranges can also have the structure where the photodiode elements are connected by the two-axis electrode.

The present invention is expected to be found practically use in multiple purpose applications such as telecommunication, imaging (where CCD or CMOS sensor cannot be used), and also many sensing applications, and also in the applications including surveillance, satellite tracking, advanced lidar systems, etc. The most important advantage of this photodiode is that the performance will not be degraded under wide range of temperature variation, which eliminates the use of the temperature controller. Other advantage of this invention is that conventional fabrication technology can be used to fabricate the single photodiode or its array herein described.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A photodiode comprising,
first ohmic contact layer;
a semiconductor structure comprising of;
   a semiconductor substrate;
   a highly doped buffer layer, material-type same as the substrate;
   a single or multiple layers of InGaAs with different compositions of In, Ga, and As without containing of Al for absorption layer;
   a doped-thin layer of InGaAs, and;
   a highly doped-thick layer of InGaAs for second ohmic contact, wherein a window is created for incident light to reach the thin layers and wherein window is in u-shape or horse-shoe shape. and;
a second ohmic metal contact on the top of the doped-thick layer.

2. The photodiode array comprises:
N×N photodiodes, wherein each photodiode comprises,
   common ohmic metal contact layer on the backside of the semiconductor substrate for all photodiodes in the array;
   the said semiconductor structure as claimed in claim 1, and;
   the said second ohmic-contact layer on the top of the highly doped-thick InGaAs layer as claimed in claim 1, and;
monolithically fabricated interconnection metal line, wherein each metal line is connecting each photodiode to the outside pad, and each photodiode is independently addressable and:
an antireflection coating (AR) layer,
wherein surrounding region of each photodiode in the said array is etch out to at least portion of the said absorption layer and wherein the light is incident from the too of the photodiode.

3. The said interconnection metal lines as claimed in claim 2, connects the photodiodes in a way that at a time only one photodiode signal can be taken out located in the same row and column.

4. The said interconnection metal lines, as claimed in claim 2, can be designed in a way that metal connection of each photodiode located inside one-fourth of the array are designed to align in two sides, replica of this metal layout can be copied for metal connection alignment for other photodiodes located inside the three-fourth of the array.

5. The photodiode array comprises:
N×N photodiodes, wherein each photodiode comprises,
   an antireflective coating (AR);
   a common ohmic contact layer;
   a etch-off semiconductor substrate to open for incident light;
   the said semiconductor structure as claimed in claim 1; and;
   the said second ohmic metal contact layer, as claimed in claim 1, on the top of the said highly doped-thick InGaAs layer
wherein a common ohmic contact connecting directly to the substrate, can be made by opening thru-hole from the front side of the substrate to make compatible for flip-chip bonding.

6. The said highly doped-thin layer of InGaAs, as claimed in claim 1, is on the light incident surface for the top-incident type photodiode.

7. The said highly doped-thick layer of InGaAs, as claimed in claim 1, could be single high-doped InAlAs material or highly doped multiple layers of InAlAs and InGaAs.

8. The said single high-doped InAlAs layer or said multiple high-doped InAlAs and high-doped InGaAs layers, as claimed in claim 7, could be the graded layer incorporated in the structure to reduce the resistance at the InAlAs-InGaAs band-edge discontinuity.

9. The said substrate type as claimed in claims 1, is InP, SF InGaAs, or GaAs.

10. The highly doped-thin InGaAs layer and highly doped-thick InGaAs layer, as claimed in claim 1, can have the same or different level of doping.

11. The fabrication process of the photodiode array of top-incident type, comprises,
 (a) growing the layers forming the photodiode structure on the said substrate as claimed in claim 1;
 (b) patterning and dry etching of highly doped thick layer of InGaAs, as claim in claim 1, to open the incident surface;
 (c) formation of the top ohmic contact;
 (d) patterning and dry-etching the diode structure to isolate from each other;
 (e) depositing the step coverage layer and planarization;
 (f) patterning and formation metal lines connecting the photodiode contact to the outside pad;
 (g) etch out the dielectric from the incident surface;
 (h) polishing the substrate and formation of the common ohmic contact at the back side of the substrate, and;
 (i) formation of antireflection coating on the top of the surface.

12. The metal lines, as claimed in claim 2, can be made using the molding like nano or micro-scaled level imprinting.

13. The fabrication process of the photodiode array of bottom-incident type, comprises,
 (a) growing the layers forming the photodiode structure on the said substrate as claimed in claim 1;
 (b) patterning and formation of the top ohmic contact;
 (c) patterning and dry-etching the diode structure to isolate from each other;
 (d) depositing the step coverage layer and planarization;
 (e) formation of the common ohmic contact at the back side of the substrate;
 (f) etching-off back side of the substrate to open the incident light surface, and;
 (g) formation of antireflection coating on the bottom light incident surface.

14. The AR coating as claimed in claim 2 is single layer or multiple layers of metal oxides.

15. The dry etching for isolating each photodiode element from each other, as claimed in claim 11 is needed to etch out down to the intrinsic absorption layer or more bellower than that.

16. The dry etching for isolating photodiode element from each other as claimed in claim 11 is needed to be etch out down to the surface of the said substrate or below than its surface.

17. At least one tunable filter can be monolithically integrated on the said photodiode, as claimed in claim 1, to tune the wavelength as necessary.

18. The fabrication process of single photodiode of top-incident type, comprises,
 (a) growing the layers forming the photodiode structure on the substrate as claimed in claim 1;
 (b) patterning and dry etching of highly doped thick layer of InGaAs, as claim in claim 1, to open the incident surface;
 (c) formation of the top ohmic contact;
 (d) polishing the substrate to appropriate thickness and formation of the bottom ohmic contact, and;
 (e) formation antireflection coating on the top of the surface.

19. The fabrication process of the single photodiode of bottom-incident type, comprises,
 (a) growing the layers forming the photodiode structure on the said substrate as claimed in claim 1;
 (b) patterning and formation of the top ohmic contact;
 (c) formation of the common ohmic contact at the back side of the substrate;
 (d) etching-off back side of the substrate to open the incident light surface, and;
 (f) formation of antireflection coating on the bottom light incident surface.

20. At least one tunable filter can be integrated with the photodiode array, as claimed in claim 2 to filter the wavelengths spatially along the arrays.

21. A photodiode comprising,
 first ohmic contact layer;
 a semiconductor structure comprising of;
  a semiconductor substrate;
  a highly doped buffer layer, material-type same as the-substrate;
  at least one layer of InGaAs with different compositions of In, Ga, and As without containing of Al for absorption layer;
  a doped-thin layer of InGaAs, and;
  a highly doped-thick layer of InGaAs for second ohmic contact, wherein a window is created for the incident light to reach to the InGaAs thin layer and wherein the said window is in square-shape, or rectangular-shape, or circular-shape, and;
 a second ohmic metal contact on the top of the said doped-thick layer.

* * * * *